US011705865B2

(12) United States Patent
Cao et al.

(10) Patent No.: US 11,705,865 B2
(45) Date of Patent: Jul. 18, 2023

(54) RELAXATION OSCILLATOR, INTEGRATED CIRCUIT AND ELECTRONIC APPARATUS

(71) Applicant: INNOGRIT TECHNOLOGIES CO., LTD., Shanghai (CN)

(72) Inventors: Chi Cao, Shanghai (CN); Kangmin Hu, Shanghai (CN)

(73) Assignee: INNOGRIT TECHNOLOGIES CO., LTD., Shanghai (CN)

( * ) Notice: Subject to any disclaimer, the term of this patent is extended or adjusted under 35 U.S.C. 154(b) by 8 days.

(21) Appl. No.: 17/846,261

(22) Filed: Jun. 22, 2022

(65) Prior Publication Data
US 2023/0083079 A1    Mar. 16, 2023

(30) Foreign Application Priority Data
Sep. 16, 2021 (CN) ............................ 202111086861.2

(51) Int. Cl.
*H03K 3/0231* (2006.01)
*H03B 5/24* (2006.01)

(52) U.S. Cl.
CPC .................................. *H03B 5/24* (2013.01); *H03K 3/0231* (2013.01)

(58) Field of Classification Search
CPC ........... H03B 5/24; H03K 3/012; H03K 3/013; H03K 3/0231
USPC .................................. 331/111, 143-145, 153
See application file for complete search history.

(56) References Cited

U.S. PATENT DOCUMENTS

| 4,370,628 | A | * | 1/1983 | Henderson et al. | ...... | H03K 3/03 |
| | | | | | | 331/113 R |
| 5,194,831 | A | * | 3/1993 | Jackson | ............... | H03K 3/0231 |
| | | | | | | 331/111 |
| 5,426,384 | A | * | 6/1995 | May | .................... | H03K 3/0322 |
| | | | | | | 331/34 |
| 2015/0270804 | A1 | * | 9/2015 | Blaauw et al. | ......... | H03K 3/011 |
| | | | | | | 331/108 R |
| 2017/0214392 | A1 | * | 7/2017 | Lee et al. | ............... | H03K 3/012 |
| 2018/0219536 | A1 | * | 8/2018 | Lee et al. | ............... | H03K 3/013 |

\* cited by examiner

*Primary Examiner* — Levi Gannon
(74) *Attorney, Agent, or Firm* — Womble Bond Dickinson (US) LLP

(57) ABSTRACT

The present disclosure relates to a relaxation oscillator, an integrated circuit and an electronic apparatus, the relaxation oscillator comprising a first signal generation module and an oscillation module configured to output a first oscillation signal and a second oscillation signal, the first oscillation signal and the second oscillation signal being opposite in phase, the oscillation module comprising a first switch, a second switch, a capacitor, and a comparison unit. The oscillation module according to the disclosed embodiment using a floating amplifier to implement a comparator, where in a pre-charging stage, the first switch and the second switch are turned on to charge the capacitor, and a common mode of the first oscillation signal and the second oscillation signal is determined; in a comparing stage, the first switch and the second switch are turned off to output the oscillation signal. The embodiment of the present disclosure eliminates the need to provide an additional common mode feedback generation circuit, and does not require an increase in power consumption, achieving the advantages of smaller occupied area, lower power consumption, less noise, and better performance as compared with a relaxation oscillator of the related art.

10 Claims, 3 Drawing Sheets

RELAXATION OSCILLATOR, INTEGRATED CIRCUIT AND ELECTRONIC APPARATUS

TECHNICAL FIELD

The present disclosure relates to the technical field of integrated circuits, in particular to a relaxation oscillator, an integrated circuit and an electronic apparatus.

BACKGROUND

In an integrated circuit, generally a clock signal is generated by an oscillator. Relaxation oscillator is the most commonly used oscillator circuit, which realizes oscillation signal output by charging and discharging capacitor(s). The frequency of the oscillation signal is adjustable by adjusting a charging/discharging current or the capacity of. As compared with other various types of oscillators, a relaxation oscillator has relatively good long-term stability in frequency and good temperature stability. The industry and the academic circle are making constant efforts to explore the potential of a relaxation oscillator in long-term stability in frequency and temperature stability (e.g., suppression of flicker noise, detection and compensation for temperature). However, the relaxation oscillator has the disadvantage that the phase noise at high frequency offset is higher than that of a ring oscillator, which therefore causes poor performance in clock period jitter.

SUMMARY

According to an aspect of the present disclosure, provided is a relaxation oscillator, comprising a first signal generation module and an oscillation module configured to output a first oscillation signal and a second oscillation signal, the first oscillation signal and the second oscillation signal being opposite in phase, wherein,
the first signal generation module is connected to the oscillation module and is configured to generate a first voltage signal and a second voltage signal according to the first oscillation signal and the second oscillation signal, wherein, in a work cycle, the first voltage signal gradually decreases from a first electric potential that is higher than a supply voltage to a second electric potential that is lower than a threshold voltage, the second voltage signal gradually increases from a third electric potential that is lower than a common ground voltage to a fourth electric potential that is higher than the threshold voltage;
the oscillation module comprises a first switch, a second switch, a capacitor, and a comparison unit, a first end of the first switch being configured to receive the supply voltage, a second end of the first switch being connected to a first end of the capacitor and a first end of the comparison unit, a first end of the second switch being connected to ground, a second end of the second switch being connected to a second end of the capacitor and a second end of the comparison unit, a first input end of the comparison unit being configured to input the first voltage signal, a second input end of the comparison unit being configured to input the second voltage signal,
wherein, in a pre-charging stage of the work cycle, the first switch and the second switch are turned on to charge the capacitor, the first end of the capacitor and the second end of the capacitor are charged to the supply voltage and the common ground voltage, respectively;
wherein, in a comparing stage of the work cycle, the first switch and the second switch are turned off, the comparison unit compares the first voltage signal and the second voltage signal with the threshold voltage, respectively, and outputs the first oscillation signal and the second oscillation signal based on a result of the comparing.

In a possible implementation, the first voltage signal and the second voltage signal are axisymmetric with respect to the threshold voltage, the threshold voltage being a half of a sum of the supply voltage and the common ground voltage.

In a possible implementation, the comparison unit is configured such that:
in a case where the first voltage signal is higher than the threshold voltage, and the second voltage signal is lower than the threshold voltage, an electric potential of the second oscillation signal output by the comparison unit is the common ground voltage, an electric potential of the first oscillation signal output by the comparison unit is the supply voltage;
in a case where the first voltage signal decreases to be lower than the threshold voltage, and the second voltage signal increases to be higher than the threshold voltage, an electric potential of the second oscillation signal output by the comparison unit is the supply voltage, an electric potential of the first oscillation signal output by the comparison unit is the common ground voltage.

In a possible implementation, the relaxation oscillator further comprises:
a second signal generation module connected to the first signal generation module and configured to generate a switch control signal according to the first voltage signal and the second voltage signal, so as to turn the first switch and the second switch on in the pre-charging stage and turn the first switch and the second switch off in the comparing stage.

In a possible implementation, the second signal generation module comprises a first drive transistor, a second drive transistor, a third drive transistor, a fourth drive transistor, a fifth drive transistor, and a sixth drive transistor, wherein,
a gate of the first drive transistor is configured to receive the first voltage signal, a source of the first drive transistor is configured to receive the supply voltage, a drain of the first drive transistor is connected to a source of the second drive transistor,
a gate of the second drive transistor is configured to receive the second voltage signal, a drain of the second drive transistor is connected to a drain of the third drive transistor, a drain of the fourth drive transistor, a gate of the fifth drive transistor, and a gate of the sixth drive transistor,
a gate of the third drive transistor is configured to receive the first voltage signal, a source of the third drive transistor is connected to ground,
a gate of the fourth drive transistor is configured to receive the second voltage signal, a source of the fourth drive transistor is connected to ground,
a source of the fifth drive transistor is configured to receive a supply voltage, a source of the sixth drive transistor is connected to ground, and a drain of the fifth drive transistor is connected to a drain of the sixth drive transistor for outputting the switch control signal.

In a possible implementation, the first signal generation module comprises a chopper switching circuit and a signal generation unit, the signal generation unit including a first resistor, a second resistor, a first capacitor, and a second capacitor, an input end of the chopper switching circuit being configured to receive the first oscillation signal and the second oscillation signal, a first output end of the chopper switching circuit being connected to a first end of the first resistor and a first end of the first capacitor, a second output end of the chopper switching circuit being connected to a first end of the second resistor and a first end of the second capacitor, a second end of the first capacitor being connected to a second end of the second resistor and configured to output the first voltage signal, a second end of the first resistor being connected to a second end of the second capacitor and configured to output the second voltage signal.

In a possible implementation, the chopper switching circuit comprises a first chopper switching transistor, a second chopper switching transistor, a third chopper switching transistor, and a fourth chopper switching transistor, a source of the first chopper switching transistor being connected to a source of the second chopper switching transistor and configured to receive the supply voltage, a gate of the first chopper switching transistor being configured to receive the second oscillation signal, and a drain of the first chopper switching transistor being connected with a source of the third chopper switching transistor to serve as the first output end of the chopper switching circuit, a gate of the second chopper switching transistor being configured to receive the first oscillation signal, a drain of the second chopper switching transistor being connected with a source of the fourth chopper switching transistor to serve as the second output end of the chopper switching circuit, a gate of the third chopper switching transistor being configured to receive the second oscillation signal, a gate of the fourth chopper switching transistor being configured to receive the first oscillation signal, a drain of the third chopper switching transistor and a drain of the fourth chopper switching transistor being connected to ground.

In a possible implementation, the comparison unit comprises a first comparison transistor, a second comparison transistor, a third comparison transistor, and a fourth comparison transistor, a source of the first comparison transistor and a source of the third comparison transistor being connected to the first end of the capacitor, a gate of the first comparison transistor being connected to a gate of the second comparison transistor, for receiving the first voltage signal, a drain of the first comparison transistor being connected to a drain of the second comparison transistor, for outputting the first oscillation signal, a gate of the third comparison transistor being connected to a gate of the fourth comparison transistor, for receiving the second voltage signal, a drain of the third comparison transistor being connected to a drain of the fourth comparison transistor, for outputting the second oscillation signal, a source of the second comparison transistor and a source of the fourth comparison transistor being connected to the second end of the capacitor.

According to an aspect of the present disclosure, provided is an integrated circuit, comprising the above relaxation oscillator.

According to an aspect of the present disclosure, provided is an electronic apparatus, comprising the above integrated circuit.

An embodiment of the present disclosure provides a relaxation oscillator comprising a first signal generation module and an oscillation module. According to the embodiment of the present disclosure, the first signal generation module generates a first voltage signal and a second voltage signal according to the first oscillation signal and the second oscillation signal output by the oscillation module. The first signal generation module has a function of signal amplification to increase the swing of the comparison unit; that is, in a work cycle, the first voltage signal is higher than the supply voltage in a period, the second voltage signal is lower than the common ground voltage in a period, wherein, in a work cycle, the first voltage signal gradually decreases from a first electric potential that is higher than the supply voltage to a second electric potential that is lower than the threshold voltage, the second voltage signal gradually increases from a third electric potential that is lower than common ground voltage to a fourth electric potential that is higher than the threshold voltage. As such, it is possible to realize control over the oscillation module by means of the first voltage signal and the second voltage signal, so as to cause the oscillation module to output an oscillation signal. The oscillation module according to an embodiment of the present disclosure comprises a first switch, a second switch, a capacitor, and a comparison unit, a first end of the first switch being configured to receive the supply voltage, a second end of the first switch being connected to a first end of the capacitor and a first end of the comparison unit, a first end of the second switch being connected to ground, a second end of the second switch being connected to a second end of the capacitor and a second end of the comparison unit, a first input end of the comparison unit being configured to input the first voltage signal, a second input end of the comparison unit being configured to input the second voltage signal, wherein, in a pre-charging stage of the work cycle, the first switch and the second switch are turned on to charge the capacitor, the first end of the capacitor and the second end of the capacitor are charged to the supply voltage and the common ground voltage, respectively, wherein, in a comparing stage of the work cycle, the first switch and the second switch are turned off, the comparison unit compares the first voltage signal and the second voltage signal with the threshold voltage, respectively, and outputs the first oscillation signal and the second oscillation signal based on a result of the comparing. The oscillation module according to an embodiment of the present disclosure uses a floating amplifier to implement the comparator; in the pre-charging stage, a common mode of the first oscillation signal and the second oscillation signal is determined; in the comparing stage, the oscillation signal is output. The embodiment of the present disclosure eliminates the need to provide an additional common mode feedback generation circuit, and does not require an increase of power consumption, achieving the advantages of smaller occupied area, lower power consumption, less noise, and better performance as compared with a relaxation oscillator of the related art.

It is appreciated that the foregoing general description and the subsequent detailed description are merely illustrative and interpretive, and are not intended to limit the present disclosure. Additional features and aspects of the present disclosure will become apparent from the following detailed description of exemplary examples with reference to the attached drawings.

BRIEF DESCRIPTION OF THE DRAWINGS

The attached drawings, which are incorporated in the specification and constitute part of the specification, illustrate embodiments according to the present disclosure and serve to explain the technical solutions of the present disclosure together with the description.

DETAILED EMBODIMENTS

Figure 1:
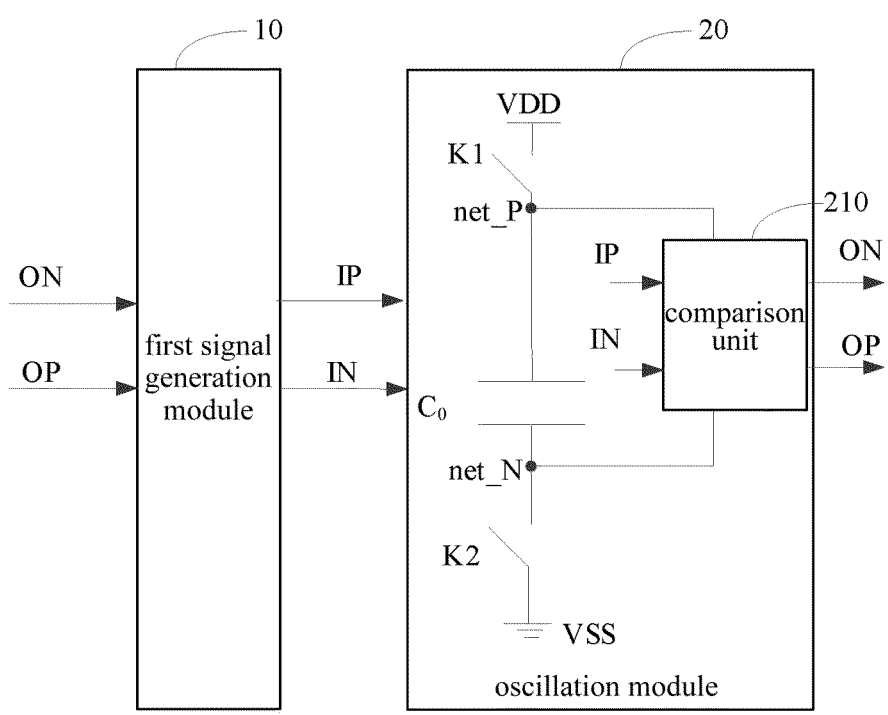
FIG. 1 is a schematic diagram of a relaxation oscillator according to an embodiment of the present disclosure.

Various exemplary examples, features and aspects of the present disclosure will be described in detail with reference to the drawings. The same reference numerals in the drawings represent elements having the same or similar functions. Although various aspects of the examples are shown in the drawings, it is unnecessary to draw the drawings in scale unless otherwise specified.

In the description of the present disclosure, it is appreciated that an orientation or positional relationship indicated by the terms "length," "width," "upper" "lower", "front", "rear", "left", "right", "vertical", "horizontal", "top", "bottom", "inner", "outer" and the like is an orientation or positional relationship based on the accompanying drawings, which is merely for facilitating and simplifying the description of the present disclosure, but not indicating or implying that the referred device or element must have particular orientation, be constructed and operate in particular orientation, and therefore cannot be construed as a limitation to the present disclosure.

Herein the terms "first" and "second" are merely for descriptive purpose, but cannot be construed as indicating or implying relative importance or implicitly specifying the amount of the indicated technical feature. Thus, features limited with "first" and "second" may explicitly or implicitly include one or more those features. In the description of the present disclosure, "a plurality of" means two or more, unless expressly and specifically limited otherwise.

In the present disclosure, unless expressly specified and limited otherwise, the terms "mount", "link", "connect", "fix" and the like shall be interpreted in a broad sense, for example, may be a fixed connection or a removable connection or an integral connection; a mechanical connection or an electrical connection; a direct link or an indirect link; a direct connection or an indirect connection realized by an intermediate medium; an connection within two elements or an interactive relationship between two elements. For those of ordinary skill in the art, the specific meaning of the above terms in the present disclosure may be understood on a case-by-case basis.

The special word "exemplary" here means "used as an example, embodiment, or illustrative". Any embodiment illustrated herein as "exemplary" is not necessarily to be construed as preferred over or better than other embodiments.

Herein the term "and/or" is an association relation between associated objects and indicates three possible relations. For example, "A and/or B" indicates a case where only A is present, a case where A and B are both present, and a case where only B is present. In addition, the term "at least one" herein indicates any one of a plurality or any combination of at least two of a plurality. For example, including at least one of A, B and C means including any one or more elements selected from a set consisting of A, B and C.

Numerous details are given in the following embodiments for the purpose of better explaining the present disclosure. It should be understood by a person skilled in the art that the present disclosure may still be realized even without some of those details. In some of the examples, methods, means, elements and circuits that are well known to a person skilled in the art are not described in detail so that the main concept of the present disclosure become apparent.

In related technical solutions, the common mode of the comparator of the relaxation oscillator is implemented by an additional biasing circuit, for example, set by a biasing circuit that outputs head/tail current source/sink. However, the source current and the sink current restrict the maximum transconductance achievable by rapid edge transition and increase noise from the biasing circuit, both of which having an adverse effect on the phase noise of the oscillator such that the noise is increased and the power consumption is increased. As a result, the relaxation oscillator has a poor performance. In order to reduce the noise, the related arts employ some solutions. For example, the related arts suppress the noise by increasing power consumption, or filter the noise using a bulky RC filter, which further increases the power consumption , and increases the area of the circuit, leading to even higher costs.

An embodiment of the present disclosure provides a relaxation oscillator comprising a first signal generation module and an oscillation module. According to the embodiment of the present disclosure, the first signal generation module generates a first voltage signal and a second voltage signal according to the first oscillation signal and the second oscillation signal output by the oscillation module. The first signal generation module has a function of signal amplification to amplify the swing of the comparison unit; that is, in a work cycle, the first voltage signal is temporarily higher than the supply voltage in a period, the second voltage signal is temporarily lower than the common ground voltage in a period, wherein, in a work cycle, the first voltage signal gradually decreases from a first electric potential that is higher than the supply voltage to a second electric potential that is lower than the threshold voltage, the second voltage signal gradually increases from a third electric potential that is lower than common ground voltage to a fourth electric potential that is higher than the threshold voltage. As such, it is possible to realize control over the oscillation module by means of the first voltage signal and the second voltage signal, so as to cause the oscillation module to output an oscillation signal. The oscillation module according to an embodiment of the present disclosure comprises a first switch, a second switch, a capacitor, and a comparison unit, a first end of the first switch being configured to receive the supply voltage, a second end of the first switch being connected to a first end of the capacitor and a first end of the comparison unit, a first end of the second switch being connected to ground, a second end of the second switch being connected to a second end of the capacitor and a second end of the comparison unit, a first input end of the comparison unit being configured to input the first voltage signal, a second end of the comparison unit being configured to input the second voltage signal, wherein, in a pre-charging stage of the work cycle, the first switch and the second switch are connected to charge the capacitor, a first end of the capacitor and a second end of the capacitor are charged to the supply voltage and the common ground voltage, respectively, wherein, in a comparing stage of the work cycle, the first switch and the second switch are disconnected, the comparison unit compares the first voltage signal and the second voltage signal with the threshold voltage, respectively, and outputs the first oscillation signal and the second oscillation signal based on a result of the comparing. The oscillation module according to an embodiment of the present disclosure uses a floating amplifier to implement the comparator; in the pre-charging stage, a common mode of the first oscillation signal and the second oscillation signal is determined; in the comparing stage, the oscillation signal is output. The embodiment of the present disclosure eliminates the need to provide an additional common mode feedback generation circuit, and does not require an increase of power consumption, achieving the advantages of smaller occupied area, lower power consumption, less noise, and better performance as compared with a relaxation oscillator of the related art.

The relaxation oscillator according to an embodiment of the present disclosure is applicable to an integrated circuit of various specifications to provide a clock or for other purposes, which is not limited in the embodiment of the present disclosure.

Referring to FIG. 1, FIG. 1 is a schematic diagram of a relaxation oscillator according to an embodiment of the present disclosure.

Figure 2:
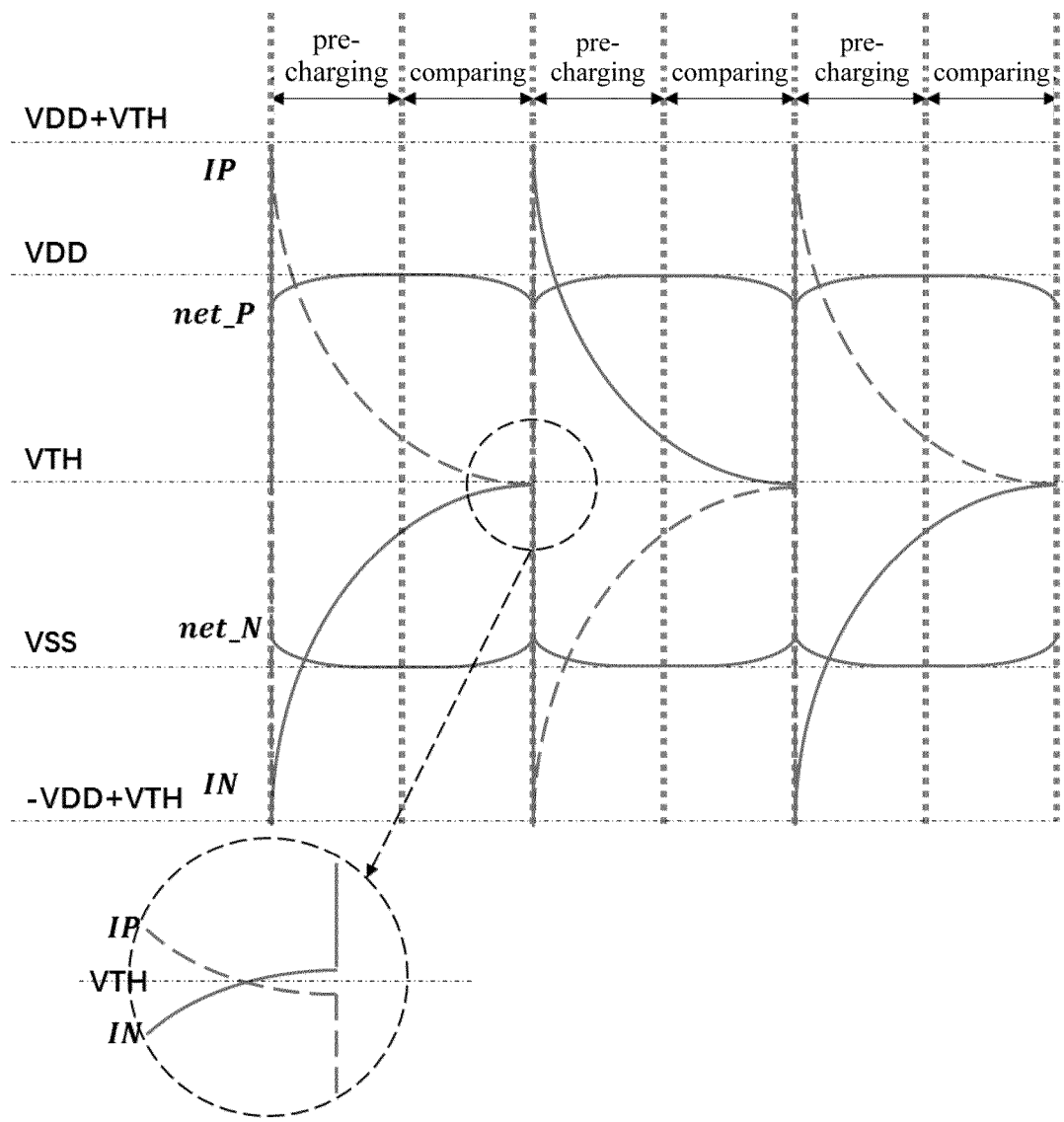
FIG. 2 is a schematic diagram of a work timing of a relaxation oscillator according to an embodiment of the present disclosure.

Referring to FIG. 2, FIG. 2 is a schematic diagram of a work timing of a relaxation oscillator according to an embodiment of the present disclosure.

As shown in FIG. 1, the relaxation oscillator comprises the first signal generation module 10 and the oscillation module 20, the oscillation module 20 being configured to output the first oscillation signal ON and the second oscillation signal OP, the first oscillation signal ON and the second oscillation signal OP being opposite in phase, wherein, the first signal generation module 10 is connected to the oscillation module 20 and is configured to generate the first voltage signal IP and the second voltage signal IN according to the first oscillation signal ON and the second oscillation signal OP, wherein, as shown in FIG. 2, in a work cycle, the first voltage signal IP gradually decreases from a first electric potential that is higher than the supply voltage VDD to a second electric potential that is lower than the threshold voltage VTH, the second voltage signal IN gradually increases from a third electric potential that is lower than the common ground voltage VSS to a fourth electric potential that is higher than the threshold voltage VTH;

the oscillation module 20 comprises the first switch K1, the second switch K2, the capacitor $C_0$, and the comparison unit 210, the first end of the first switch K1 being configured to receive the supply voltage VDD, the second end of the first switch K1 being connected to the first end of the capacitor $C_0$ and the first end of the comparison unit 210, the first end of the second switch K2 is connected to ground, the second end of the second switch K2 being connected to the second end of the capacitor $C_0$ and the second end of the comparison unit 210, the first input end of the comparison unit 210 being configured to input the first voltage signal IP, the second end of the comparison unit 210 being configured to input the second voltage signal IN, wherein, in a pre-charging stage of the work cycle, the first switch K1 and the second switch K2 are turned on to charge the capacitor C0, the first end and the second end of the capacitor C0 is charged to the supply voltage VDD and the common ground voltage VSS, respectively, wherein, in a comparing stage of the work cycle, the first switch K1 and the second switch K2 are turned off, and the comparison unit 210 compares the first voltage signal IP and the second voltage signal IN with the threshold voltage VTH, respectively, and outputs the first oscillation signal ON and the second oscillation signal OP based on a result of the comparing.

In an example, as shown in FIG. 2, the first electric potential may be VDD+VTH or smaller than VDD+VTH; the second electric potential is smaller than the threshold voltage VTH and is greater than the common ground voltage VSS; the third electric potential may be -VDD-VTH or greater than -VDD-VTH; the fourth electric potential may be greater than the threshold voltage VTH and smaller than the supply voltage VDD. The specific electric potential of each voltage is not limited in the embodiment of the present disclosure, and may be set by those skilled in the art according to the actual situation or the needs. Exemplarily, a comparator circuit generally has an equivalent input offset voltage Voffset, the second electric potential may be VTH+m*Voffset, and the fourth electric potential may be VTH−n*Voffset, wherein m and n may be positive numbers. The specific value of m, n is not limited in the embodiment of the present disclosure and may be set by those skilled in the art according to the actual situation and the needs. Exemplarily, m, n may be 0.5. The specific magnitude of the offset voltage Voffset is not limited in the embodiment of the present disclosure. The offset voltage Voffset may be different or the same for each inverter of various comparator circuits.

In a possible implementation, as shown in FIG. 2, the first voltage signal IP and the second voltage signal IN are axisymmetric with respect to the threshold voltage VTH. It should be noted that the threshold voltage VTH mentioned herein may be deemed as an ideal value. In actual cases, based on different components in the circuit, the threshold voltage VTH may be different. For example, as mentioned above, an inverter in the comparator circuit may have different offset voltage Voffset. Therefore, the actual threshold voltage for each inverter may be different; that is, the first voltage signal IP and the second voltage signal IN may correspond to different threshold voltage VTH, which is not limited in the embodiment of the present disclosure.

In an example, the threshold voltage VTH may be a half of the sum of the supply voltage VDD and the common ground voltage VSS. Exemplarily, the potential of the common ground voltage VSS may be 0V, so the threshold voltage VTH may be VDD/2. The subsequent description of the exemplary embodiment of the present disclosure is based on a VSS of 0.

In an example, as shown in FIG. 1 and FIG. 2, in the pre-charging stage of the work cycle, when the first switch K1 and the second switch K2 are turned on, nodes net_P (the first end of the capacitor C0) and net_N (the second end of the capacitor C0) are pre-charged to electric potentials VDD and VSS, respectively; the common mode is set to VDD/2 (VSS being 0). In an example, as shown in FIG. 1 and FIG. 2, in the comparing stage of the work cycle, the first switch K1 and the second switch K2 are turned off, and the comparison unit 210 is disconnected from the common ground voltage VSS to realize floating; in the comparing stage, any current of related branches of net_P and net_N must pass through C0. Therefore, the net current of the common mode is 0. In the comparing stage, the comparison unit performs charge exchange by means of the capacitor C0 in a floating state. An embodiment of the present disclosure implements a floating comparator by setting the working method of the oscillation module 20 to achieve a common mode of VDD/2 of the two output ends of the comparison unit 210, saving the need to provide an external circuit (e.g., a common mode feedback generation circuit) to assist the common mode. As compared with the related art of setting the common mode voltage by means of an external circuit, the embodiment of the present disclosure has a better performance of less area occupied by the circuit, lower costs, less noise, and lower power consumption. Furthermore, the oscillation module according to an embodiment of the present disclosure is implemented based on a floating comparator, making it possible to realize maximized transconductance of the comparator, thereby further reducing the noise and improving the performance of the relaxation oscillator, and save the need of a current control transistor for controlling current, further reducing the area of the circuit and saving the cost.

In an embodiment of the present disclosure, the two stages of "pre-charging" and "comparing" in a work cycle do not depend on precise time control. In the "pre-charging" stage, the capacitor $C_0$ is charged by being connected with VDD and VSS via the first switch K1 and the second switch K2; in the "comparing" stage, the capacitor $C_0$ is disconnected from VDD and VSS by the first switch K1 and the second switch K2, thereby ensuring that the comparator operates in a "floating" state to output a common mode level of "OP" and "ON". The transition between the two stages "pre-charging" and "comparing" occurs in a wide time window and does not affect the overall phase noise performance, thereby realizing PVT (Process-Voltage-Temperature) robustness.

In a possible implementation, the comparison unit 210 may be configured such that:
when the first voltage signal IP is higher than the threshold voltage VTH, and the second voltage signal IN lower than the threshold voltage VTH, the electric potential of the second oscillation signal OP output by the comparison unit 210 is the common ground voltage VSS, the electric potential of the first oscillation signal ON output by the comparison unit 210 is the supply voltage VDD;
when the first voltage signal IP decreases to be lower than the threshold voltage VTH, and the second voltage signal IN increases to be higher than the threshold voltage VTH, the electric potential of the second oscillation signal OP output by the comparison unit 210 is the supply voltage VDD, and the electric potential of the first oscillation signal ON output by the comparison unit 210 is the common ground voltage VSS.

As such, the comparison unit 210 according to an embodiment of the present disclosure is capable of comparing the first voltage signal IP, the second voltage signal IN with the threshold voltage VTH in the comparing stage of each cycle, so as to output the first oscillation signal ON and the second oscillation signal OP based on a result of the comparing.

A switch control signal Pre for the first switch K1 and the second switch K2 may be generated from various sources and in various methods according to an embodiment of the present disclosure, which is not limited in the embodiment of the present disclosure and is exemplarily described subsequently.

Figure 3:
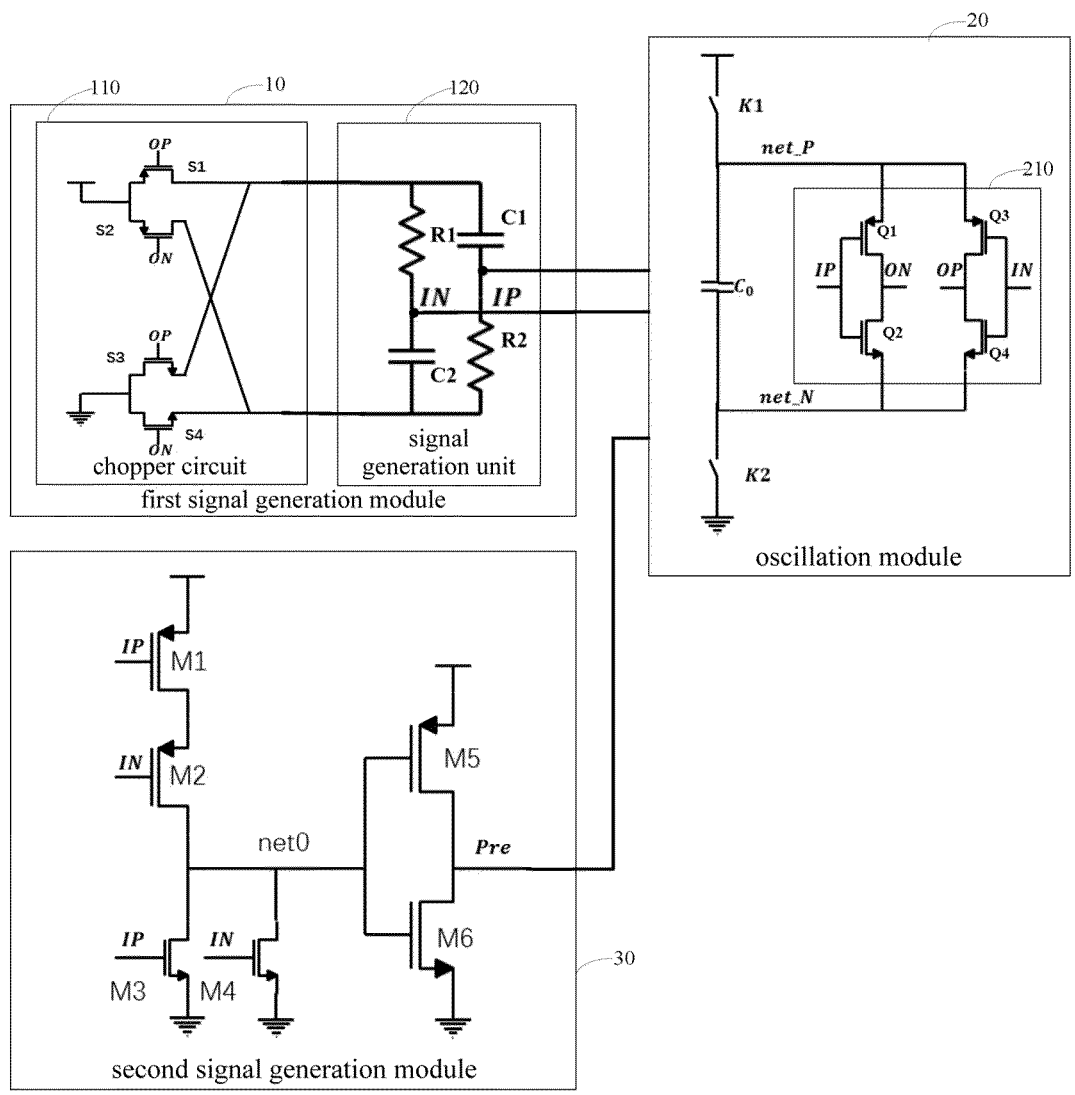
FIG. 3 is a schematic diagram of a relaxation oscillator according to an embodiment of the present disclosure.

Referring to FIG. 3, FIG. 3 is a schematic diagram of a relaxation oscillator according to an embodiment of the present disclosure.

In a possible implementation, as shown in FIG. 3, the relaxation oscillator may further comprise:

a second signal generation module 30 connected to the first signal generation module 10 and configured to generate the switch control signal Pre according to the first voltage signal IP and the second voltage signal IN, so as to turn on the first switch K1 and the second switch K2 in the pre-charging stage and turn off the first switch K1 and the second switch K2 in the comparing stage.

According to an embodiment of the present disclosure, the switch control signal Pre may be generated by the second signal generation module 30 with the first voltage signal IP and the second voltage signal IN as the input. It should be noted that the charging process is not required to strictly follow a time sequence. Moreover, since the first switch K1 and the second switch K2 are both in a turned off state when the comparison unit operates (the comparing stage), the pre-charging does not introduce a phase noise, and thus does not affect the phase noise of the oscillator. Therefore, the relaxation oscillator of an embodiment of the present disclosure allows a design based on a minimum power, realizing extremely low power consumption.

It should be noted that, although an embodiment of the present disclosure is described exemplarily with the second signal generation module 30 serving as the source of the switch control signal Pre, the present disclosure is not limited hereto. The switch control signal Pre may be generated by another circuit or component, optionally with the first voltage signal IP and the second voltage signal IN as the input, or according to a preset logical timing. For example, according to an embodiment of the present disclosure, the switch control signal Pre may be generated by means of a pulse-width modulation PWM circuit, a signal generation component, and the like. Exemplarily, the pulse width of the PWM may be set according to the actual situation and the needs, so as to generate the switch control signal Pre. The specific implementation of the PWM circuit is not limited in the embodiment of the present disclosure, and may be realized by those skilled in the art based on the related art. Exemplarily, the signal generation component may be implemented by any suitable method, for example, by one or more of application-specific integrated circuit (ASIC), digital signal processor (DSP), digital signal processing device (DSPD), programmable logic device (PLD), field programmable gate array (FPGA), controller, microcontroller, microprocessor, or other electronic element. In another implementation, a control logic may be preset for the first switch K1 and the second switch K2, so that the first switch K1 and the second switch K2 are turned on in the pre-charging stage of each work cycle and are turned off in the comparing stage of each work cycle.

In a possible implementation, as shown in FIG. 3, the second signal generation module 30 may comprise the first drive transistor M1, the second drive transistor M2, the third drive transistor M3, the fourth drive transistor M4, the fifth drive transistor M5, and the sixth drive transistor M6, wherein,
the gate of the first drive transistor M1 is configured to receive the first voltage signal IP, the source of the first drive transistor M1 is configured to receive the supply voltage VDD, the drain of the first drive transistor M1 is connected to the source of the second drive transistor M2,
the gate of the second drive transistor M2 is configured to receive the second voltage signal IN, the drain of the second drive transistor M2 is connected to the drain of the third drive transistor M3, the drain of the fourth drive transistor M4, the gate of the fifth drive transistor M5, and the gate of the sixth drive transistor M6, the gate of the third drive transistor M3 is configured to receive the first voltage signal IP, the source of the third drive transistor M3 is connected to ground, the gate of the fourth drive transistor M4 is configured to receive the second voltage signal IN, the source of the fourth drive transistor M4 is connected to ground, the source of the fifth drive transistor M5 is configured to receive the supply voltage VDD, the source of the sixth drive transistor M6 is connected to ground, the drain of the fifth drive transistor M5 is connected to the drain of the sixth drive transistor M6 and is configured to output the switch control signal Pre.

Exemplarily, the first drive transistor M1 and the second drive transistor M2 may be PMOS transistors with strong drive capability; the third drive transistor M3 and the fourth drive transistor M4 may be NMOS transistors with relatively weak drive capability; the fifth drive transistor M5 may be a PMOS transistor; the sixth drive transistor M6 may be a NMOS transistor, wherein the output signal net0 of the first drive transistor M1, the second drive transistor M2, the third drive transistor M3, and the fourth drive transistor M4 may serve to obtain the switch control signal Pre via the fifth drive transistor M5 and the sixth drive transistor M6.

Exemplarily, referring to FIG. 2, when the pre-charging stage starts, the level of the first voltage signal IP and the level of the second voltage signal IN may be temporarily higher than VDD or lower than VSS, wherein the first voltage signal IP or the second voltage signal IN which is higher than VDD is adequate to drive the third drive transistor M3 and the fourth drive transistor M4 which are relatively weak while shutting down the first drive transistor M1 and second drive transistor M2 which are relatively strong, so that net0 is pulled to VSS, thereby setting the switch control signal Pre to VDD to turn the first switch K1 and the second switch K2 on.

Exemplarily, referring to FIG. 2, in the comparing stage, since the first voltage signal IP and the second voltage signal IN are approximate to VDD/2, net0 has already been pulled to VDD by the first drive transistor M1 and the second drive transistor M2 with strong drive capability, thereby setting the switch control signal Pre to VSS to turn the first switch K1 and the second switch K2 off.

It should be noted that, the control circuit (second signal generation module 30) for the first switch K1 and the second switch K2 merely serve to assist the capacitor $C_0$ in pre-charging. The transition between the "pre-charging" stage and the "comparing" stage does not require precise time control, achieving PVT robustness; since it does not participate in the operation of the comparator in the "comparing" stage, it does not affect the phase noise of the oscillator, thereby enabling low power consumption.

The foregoing description is illustrative and should not be deemed to limit the embodiment of the present disclosure.

The implementation of the first switch K1 and the second switch K2 is not limited in the embodiment of the present disclosure. The first switch K1 and the second switch K2 may be implemented by a transistor or by another method. Although an example where the first switch K1 and the second switch K2 are driven at a high level and are turned off at a low level is described above, the embodiment of the present disclosure is not limited hereto. In some circumstances, the first switch K1 and the second switch K2 may be configured to be turned on at a low level and turned off at a high level.

The specific implementation of the first signal generation module 10 and the comparison unit 210 in the oscillation module 20 is not limited in the embodiment of the present disclosure. Those skilled in the art may implement the first signal generation module 10 and the comparison unit 210 in the oscillation module 20 by selecting a suitable method according to the actual situation and the needs. Exemplary possible implementations of the first signal generation module 10 and the comparison unit 210 in the oscillation module 20 are described subsequently.

In a possible implementation, as shown in FIG. 3, the first signal generation module 10 may comprise the chopper switching circuit 110 and the signal generation unit 120, the signal generation unit 120 comprising the first resistor R1, the second resistor R2, the first capacitor C1, and the second capacitor C2, the input end of the chopper switching circuit 110 being configured to receive the first oscillation signal ON and the second oscillation signal OP, the first output end of the chopper switching circuit 110 being connected to the first end of the first resistor R1 and the first end of the first capacitor C1, the second output end of the chopper switching circuit 110 being connected to the first end of the second resistor R2 and the first end of the second capacitor C2, the second end of the first capacitor C1 being connected to the second end of the second resistor R2 and configured to output the first voltage signal IP;

the second end of the first resistor R1 being connected to the second end of the second capacitor C2 and configured to output the second voltage signal IN.

The specific implementation of the chopper switching circuit 110 and the signal generation unit 120 are not limited in the embodiment of the present disclosure. The signal generation unit 120 may comprise a differential capacitor-resistor network in another form. Exemplarily, an embodiment of the present disclosure may determine the operating frequency of the relaxation oscillator based on a product of the resistance and the capacitance in the signal generation unit 120. The specific value of each resistance and each capacitance makes it possible to achieve an optimal phase noise performance. For example, if the resistance is reduced by half while the capacitance is doubled, the operating frequency will be the same, but the phase noise will be improved by 3 dB.

In a possible implementation, as shown in FIG. 3, the chopper switching circuit 110 may comprise the first chopper switching transistor S1, the second chopper switching transistor S2, the third chopper switching transistor S3, and the fourth chopper switching transistor S4, the source of the first chopper switching transistor S1 being connected to the source of the second chopper switching transistor S2 and configured to receive the supply voltage VDD, the gate of the first chopper switching transistor S1 being configured to receive the second oscillation signal OP, the drain of the first chopper switching transistor S1 being connected to the source of the third chopper switching transistor S3 to serve as the first output end of the chopper switching circuit 110, the gate of the second chopper switching transistor S2 being configured to receive the first oscillation signal ON, the drain of the second chopper switching transistor S2 being connected to the source of the fourth chopper switching transistor S4 to serve as the second output end of the chopper switching circuit 110, the gate of the third chopper switching transistor S3 being configured to receive the second oscillation signal OP, the gate of the fourth chopper switching transistor S4 being configured to receive the first oscillation signal ON, the drain of the third chopper switching transistor S3 and the drain of the fourth chopper switching transistor S4 being connected to ground.

The embodiment of the present disclosure controls the operation of the chopper switching circuit 110 via the first oscillation signal ON and the second oscillation signal OP to alternately change the turn-on method of each chopper switching transistor in the chopper switching circuit, so as to increase the amplitude of the two voltage signals output by the signal generation unit 120. Exemplarily, as shown in FIG. 2, when the pre-charging stage starts, the level of the first voltage signal IP and the level of the second voltage signal IN may be temporarily higher than VDD or lower than VSS. The foregoing descriptions of the chopper switching circuit 110 are exemplary; and the embodiments of the present disclosure are not limited hereto. In another embodiment, those skilled in the art may implement the chopper switching circuit 110 with a chopper switching circuit of the related art.

The foregoing descriptions of the first signal generation module 10 are exemplary. The specific implementations of the first signal generation module 10 are not limited in the embodiment of the present disclosure. In another embodiment of the present disclosure, a signal generation component of the related art may be used to generate the first voltage signal and the second voltage signal according to the first oscillation signal and the second oscillation signal, wherein, in a work cycle, the first voltage signal gradually decreases from a first electric potential that is higher than the supply voltage to a second electric potential that is lower than the threshold voltage, the second voltage signal gradually increases from a third electric potential that is lower than common ground voltage to a fourth electric potential that is higher than the threshold voltage.

In a possible implementation, as shown in FIG. 3, the comparison unit 210 may comprise the first comparison transistor Q1, the second comparison transistor Q2, the third comparison transistor Q3, and the fourth comparison transistor Q4, the source of the first comparison transistor Q1 and the source of the third comparison transistor Q3 being connected to the first end of the capacitor C0, the gate of the first comparison transistor Q1 being connected to the gate of the second comparison transistor Q2, for receiving the first voltage signal IP, the drain of the first comparison transistor Q1 being connected to the drain of the second comparison transistor Q2, for outputting the first oscillation signal ON, the gate of the third comparison transistor Q3 being connected to the gate of the fourth comparison transistor Q4, for receiving the second voltage signal IN, the drain of the third comparison transistor Q3 being connected to the drain of the fourth comparison transistor Q4, for outputting the second oscillation signal OP, the source of the second comparison transistor Q2 and the source of the fourth comparison transistor Q4 being connected to the second end of the capacitor C0.

Exemplarily, the first comparison transistor Q1 and the second comparison transistor Q2 constitutes a first inverter; the third comparison transistor Q3 and the fourth comparison transistor Q4 constitutes a second inverter. According to an embodiment of the present disclosure, the comparison unit is implemented by the first inverter and second inverter and forms a floating comparator together with the first switch K1, the second switch K2, and the capacitor C0, to be applied to the relaxation oscillator. This can improve the performance of the relaxation oscillator, reduce the power consumption and the noise, reduce the circuit area, and save the cost.

The foregoing descriptions of the comparison unit 210 are exemplary and should not be deemed to limit the embodiment of the present disclosure. In another embodiment of the present disclosure, those skilled in the art may implement the comparison unit 210 by another method.

The "floating" operating property of the oscillation module according to the embodiment of the present disclosure naturally guarantees the common mode of the output signals; the difference between the charging and discharging capability in the common mode and the differential mode ensures that the output signal can reach a full swing, further improving the performance of the oscillator. As compared with a relaxation oscillator of the prior art, the embodiment of the present disclosure simplifies the circuit elements (e.g., eliminating head/tail stacking MOS, maximizing differential gain A_diff, avoiding replica biasing circuit and bulky R&C noise filter, etc.), boosting FoM (Figure of Merit) while reducing the time required for designing.

Currently, FoM is often employed for assessing the performance of a relaxation oscillator. FoM is described subsequently.

Theoretical extreme value of the phase noise of a relaxation oscillator is $$PN_{min}(\Delta f) \approx \frac{3.1kT}{p_{min}} \left(\frac{f_0}{\Delta f}\right)^2$$

, wherein $f_0$ is the frequency of the oscillator, $PN_{min}(\Delta f)$ is the minimum value of the phase noise with a frequency offset of $\Delta f$, k is the Boltzmann constant, T is the thermodynamic absolute temperature, $P_{min}$ is the theoretical minimum power consumption for the operation of the oscillator, $\Delta f$ is the frequency offset with respect to the frequency $f_0$ of the oscillator.

Corresponding to the theoretical extreme value of the phase noise of a relaxation oscillator, $$FOM = \left| dB10\left(PN_{min}(\Delta f)\right) + dB20\left(\frac{\Delta f}{f_0}\right) + dB10\left(\frac{P_{diss}}{1mW}\right) \right| < 168.9@25°C.,$$

wherein, $P_{diss}$ is the actual power consumption of the oscillator circuit and is configured to be distinguished from $P_{min}$ (theoretical minimum power consumption). Since $P_{diss}$ is greater than $P_{min}$, the actual FoM cannot reach the theoretical extreme value. It should be noted that, the expression included in the absolute value signs is negative. Therefore, if the power consumption of the oscillator increases, corresponding $P_{diss}$ increases while the absolute value decreases, and corresponding FoM decreases.

The relaxation oscillator according to an embodiment of the present disclosure may achieve FoM larger than 166 dB, taking no consideration of full integration, and its performance maintains steady at various process corners and temperatures. Even considering the restriction imposed by full integration on chip, the relaxation oscillator according to an embodiment of the present disclosure may still achieve FoM larger than 162 dB. It can be seen that the relaxation oscillator according to an embodiment of the present disclosure has high performance approaching the theoretical extreme value.

Although the embodiments of the present disclosure have been described above, it will be appreciated that the above descriptions are merely exemplary, but not exhaustive; and that the disclosed embodiments are not limiting. A number of variations and modifications may occur to one skilled in the art without departing from the scopes and spirits of the described embodiments. The terms in the present disclosure are selected to provide the best explanation on the principles and practical applications of the embodiments and the technical improvements to the arts on market, or to make the embodiments described herein understandable to one skilled in the art.

What is claimed is:

1. A relaxation oscillator, comprising a first signal generation module and an oscillation module configured to output a first oscillation signal and a second oscillation signal, the first oscillation signal and the second oscillation signal being opposite in phase, wherein,
the first signal generation module is connected to the oscillation module and is configured to generate a first voltage signal and a second voltage signal according to the first oscillation signal and the second oscillation signal, wherein, in a work cycle, the first voltage signal gradually decreases from a first electric potential that is higher than a supply voltage to a second electric potential that is lower than a threshold voltage, the second voltage signal gradually increases from a third electric potential that is lower than a common ground voltage to a fourth electric potential that is higher than the threshold voltage;
the oscillation module comprises a first switch, a second switch, a capacitor, and a comparison unit, a first end of the first switch being configured to receive the supply voltage, a second end of the first switch being connected to a first end of the capacitor and a first end of the comparison unit, a first end of the second switch being connected to ground, a second end of the second switch being connected to a second end of the capacitor and a second end of the comparison unit, a first input end of the comparison unit being configured to input the first voltage signal, a second input end of the comparison unit being configured to input the second voltage signal,
wherein, in a pre-charging stage of the work cycle, the first switch and the second switch are turned on to charge the capacitor, the first end of the capacitor and the second end of the capacitor are charged to the supply voltage and the common ground voltage, respectively;
wherein, in a comparing stage of the work cycle, the first switch and the second switch are turned off, the comparison unit compares the first voltage signal and the second voltage signal with the threshold voltage, respectively, and outputs the first oscillation signal and the second oscillation signal based on a result of the comparing.

2. The relaxation oscillator according to claim 1, wherein the first voltage signal and the second voltage signal are axisymmetric with respect to the threshold voltage, the threshold voltage being a half of a sum of the supply voltage and the common ground voltage.

3. The relaxation oscillator according to claim 1, wherein the comparison unit is configured such that:
in a case where the first voltage signal is higher than the threshold voltage, and the second voltage signal is lower than the threshold voltage, an electric potential of the second oscillation signal output by the comparison unit is the common ground voltage, an electric potential of the first oscillation signal output by the comparison unit is the supply voltage;
in a case where the first voltage signal decreases to be lower than the threshold voltage, and the second voltage signal increases to be higher than the threshold voltage, an electric potential of the second oscillation signal output by the comparison unit is the supply voltage, an electric potential of the first oscillation signal output by the comparison unit is the common ground voltage.

4. The relaxation oscillator according to claim 1, wherein the relaxation oscillator further comprises:
a second signal generation module connected to the first signal generation module and configured to generate a switch control signal according to the first voltage signal and the second voltage signal, so as to turn the first switch and the second switch on in the pre-charging stage and turn the first switch and the second switch off in the comparing stage.

5. The relaxation oscillator according to claim 4, wherein the second signal generation module comprises a first drive transistor, a second drive transistor, a third drive transistor, a fourth drive transistor, a fifth drive transistor, and a sixth drive transistor, wherein,
a gate of the first drive transistor is configured to receive the first voltage signal, a source of the first drive transistor is configured to receive the supply voltage, a drain of the first drive transistor is connected to a source of the second drive transistor,
a gate of the second drive transistor is configured to receive the second voltage signal, a drain of the second drive transistor is connected to a drain of the third drive transistor, a drain of the fourth drive transistor, a gate of the fifth drive transistor, and a gate of the sixth drive transistor,
a gate of the third drive transistor is configured to receive the first voltage signal, a source of the third drive transistor is connected to ground,
a gate of the fourth drive transistor is configured to receive the second voltage signal, a source of the fourth drive transistor is connected to ground,
a source of the fifth drive transistor is configured to receive a supply voltage, a source of the sixth drive transistor is connected to ground, and a drain of the fifth drive transistor is connected to a drain of the sixth drive transistor for outputting the switch control signal.

6. The relaxation oscillator according to claim 1, wherein the first signal generation module comprises a chopper switching circuit and a signal generation unit, the signal generation unit including a first resistor, a second resistor, a first capacitor, and a second capacitor,
an input end of the chopper switching circuit being configured to receive the first oscillation signal and the second oscillation signal, a first output end of the chopper switching circuit being connected to a first end of the first resistor and a first end of the first capacitor, a second output end of the chopper switching circuit being connected to a first end of the second resistor and a first end of the second capacitor,
a second end of the first capacitor being connected to a second end of the second resistor and configured to output the first voltage signal,
a second end of the first resistor being connected to a second end of the second capacitor and configured to output the second voltage signal.

7. The relaxation oscillator according to claim 6, wherein the chopper switching circuit comprises a first chopper switching transistor, a second chopper switching transistor, a third chopper switching transistor, and a fourth chopper switching transistor, a source of the first chopper switching transistor being connected to a source of the second chopper switching transistor and configured to receive the supply voltage, a gate of the first chopper switching transistor being configured to receive the second oscillation signal, and a drain of the first chopper switching transistor being connected with a source of the third chopper switching transistor to serve as the first output end of the chopper switching circuit, a gate of the second chopper switching transistor being configured to receive the first oscillation signal, a drain of the second chopper switching transistor being connected with a source of the fourth chopper switching transistor to serve as the second output end of the chopper switching circuit, a gate of the third chopper switching transistor being configured to receive the second oscillation signal, a gate of the fourth chopper switching transistor being configured to receive the first oscillation signal, a drain of the third chopper switching transistor and a drain of the fourth chopper switching transistor being connected to ground.

8. The relaxation oscillator according to claim 1, wherein the comparison unit comprises a first comparison transistor, a second comparison transistor, a third comparison transistor, and a fourth comparison transistor, a source of the first comparison transistor and a source of the third comparison transistor being connected to the first end of the capacitor, a gate of the first comparison transistor being connected to a gate of the second comparison transistor, for receiving the first voltage signal, a drain of the first comparison transistor being connected to a drain of the second comparison transistor, for outputting the first oscillation signal, a gate of the third comparison transistor being connected to a gate of the fourth comparison transistor, for receiving the second voltage signal, a drain of the third comparison transistor being connected to a drain of the fourth comparison transistor, for outputting the second oscillation signal, a source of the second comparison transistor and a source of the fourth comparison transistor being connected to the second end of the capacitor.

9. An integrated circuit comprising a relaxation oscillator, the relaxation oscillator comprising a first signal generation module and an oscillation module configured to output a first oscillation signal and a second oscillation signal, the first oscillation signal and the second oscillation signal being opposite in phase, wherein, the first signal generation module is connected to the oscillation module and is configured to generate a first voltage signal and a second voltage signal according to the first oscillation signal and the second oscillation signal, wherein, in a work cycle, the first voltage signal gradually decreases from a first electric potential that is higher than a supply voltage to a second electric potential that is lower than a threshold voltage, the second voltage signal gradually increases from a third electric potential that is lower than a common ground voltage to a fourth electric potential that is higher than the threshold voltage;

the oscillation module comprises a first switch, a second switch, a capacitor, and a comparison unit, a first end of the first switch being configured to receive the supply voltage, a second end of the first switch being connected to a first end of the capacitor and a first end of the comparison unit, a first end of the second switch being connected to ground, a second end of the second switch being connected to a second end of the capacitor and a second end of the comparison unit, a first input end of the comparison unit being configured to input the first voltage signal, a second input end of the comparison unit being configured to input the second voltage signal, wherein, in a pre-charging stage of the work cycle, the first switch and the second switch are turned on to charge the capacitor, the first end of the capacitor and the second end of the capacitor are charged to the supply voltage and the common ground voltage, respectively;

wherein, in a comparing stage of the work cycle, the first switch and the second switch are turned off, the comparison unit compares the first voltage signal and the second voltage signal with the threshold voltage, respectively, and outputs the first oscillation signal and the second oscillation signal based on a result of the comparing.

10. An electronic apparatus, comprising the integrated circuit according to claim 9.

\* \* \* \* \*